(12) United States Patent
Karhade et al.

(10) Patent No.: US 11,056,466 B2
(45) Date of Patent: Jul. 6, 2021

(54) PACKAGE ON PACKAGE THERMAL TRANSFER SYSTEMS AND METHODS

(71) Applicant: Intel Corporation, Santa Clara, CA (US)

(72) Inventors: Omkar Karhade, Chandler, AZ (US); Christopher L. Rumer, Chandler, AZ (US); Nitin Deshpande, Chandler, AZ (US); Robert M. Nickerson, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/552,459

(22) Filed: Aug. 27, 2019

(65) Prior Publication Data

US 2019/0385983 A1 Dec. 19, 2019

Related U.S. Application Data

(63) Continuation of application No. 15/639,640, filed on Jun. 30, 2017, now Pat. No. 10,438,930.

(51) Int. Cl.
*H01L 23/48* (2006.01)
*H01L 23/52* (2006.01)
(Continued)

(52) U.S. Cl.
CPC .......... *H01L 25/0657* (2013.01); *H01L 21/54* (2013.01); *H01L 21/561* (2013.01); *H01L 21/565* (2013.01); *H01L 23/04* (2013.01); *H01L 23/3128* (2013.01); *H01L 23/3135* (2013.01); *H01L 23/3157* (2013.01); *H01L 23/49811* (2013.01); *H01L 24/97* (2013.01); *H01L 25/105* (2013.01); *H01L 25/50* (2013.01);
(Continued)

(58) Field of Classification Search
CPC ..... H01L 25/0657; H01L 23/04; H01L 21/54; H01L 24/97; H01L 23/3157; H01L 25/50; H01L 21/565; H01L 2225/06582; H01L 2225/06589
See application file for complete search history.

(56) References Cited

U.S. PATENT DOCUMENTS 7,279,789 B2 10/2007 Cheng
8,288,208 B1 * 10/2012 Liu ..................... H01L 23/3677
438/118

(Continued)

*Primary Examiner* — Ismail A Muse
(74) *Attorney, Agent, or Firm* — Schwabe, Williamson & Wyatt, P.C.

(57) ABSTRACT

Systems and methods for improving heat distribution and heat removal efficiency in PoP semiconductor packages are provided. A PoP semiconductor package includes a first semiconductor package that is physically, communicably, and conductively coupled to a stacked second semiconductor package. A gap forms between the upper surface of the first semiconductor package and the lower surface of the second semiconductor package. Additionally, interstitial gaps form between each of the PoP semiconductor packages disposed on an organic substrate. A curable fluid material, such as a molding compound, may be flowed both in the interstitial spaces between the PoP semiconductor packages and into the gap between the upper surface of the first semiconductor package and the lower surface of the second semiconductor package.

18 Claims, 5 Drawing Sheets

(51) Int. Cl.
  *H01L 25/065* (2006.01)
  *H01L 25/00* (2006.01)
  *H01L 23/31* (2006.01)
  *H01L 23/00* (2006.01)
  *H01L 21/56* (2006.01)
  *H01L 21/54* (2006.01)
  *H01L 23/04* (2006.01)
  *H01L 25/10* (2006.01)
  *H01L 23/498* (2006.01)

(52) U.S. Cl.
  CPC .............. *H01L 24/16* (2013.01); *H01L 24/48* (2013.01); *H01L 2224/16145* (2013.01); *H01L 2224/16225* (2013.01); *H01L 2224/16227* (2013.01); *H01L 2224/17181* (2013.01); *H01L 2224/32145* (2013.01); *H01L 2224/32225* (2013.01); *H01L 2224/48227* (2013.01); *H01L 2224/73204* (2013.01); *H01L 2224/73265* (2013.01); *H01L 2225/0651* (2013.01); *H01L 2225/06513* (2013.01); *H01L 2225/06517* (2013.01); *H01L 2225/06565* (2013.01); *H01L 2225/06568* (2013.01); *H01L 2225/06582* (2013.01); *H01L 2225/06589* (2013.01); *H01L 2924/15311* (2013.01); *H01L 2924/15331* (2013.01); *H01L 2924/181* (2013.01); *H01L 2924/1815* (2013.01); *H01L 2924/18161* (2013.01)

(56) References Cited

U.S. PATENT DOCUMENTS

| | | | |
|---|---|---|---|
| 8,698,317 B2 | 4/2014 | Seo | |
| 8,778,738 B1 | 7/2014 | Lin | |
| 9,515,057 B2 | 12/2016 | Ma | |
| 2008/0054489 A1 | 3/2008 | Farrar | |
| 2010/0327439 A1 | 12/2010 | Hwang | |
| 2011/0147945 A1 | 6/2011 | Yoshida | |
| 2011/0156233 A1 | 6/2011 | Kim | |
| 2012/0074581 A1 | 3/2012 | Guzek | |
| 2012/0139090 A1* | 6/2012 | Kim | H01L 24/11 257/659 |
| 2012/0153499 A1* | 6/2012 | Byun | H01L 25/105 257/774 |
| 2012/0193783 A1* | 8/2012 | Hong | H01L 25/105 257/737 |
| 2012/0211885 A1* | 8/2012 | Choi | H01L 21/563 257/737 |
| 2013/0168855 A1 | 7/2013 | Chen | |
| 2014/0117506 A1* | 5/2014 | Hong | H01L 25/50 257/621 |
| 2014/0124937 A1* | 5/2014 | Wu | H01L 21/4853 257/772 |
| 2014/0138816 A1* | 5/2014 | Lu | H01L 23/49827 257/737 |
| 2014/0246788 A1* | 9/2014 | Kim | H01L 25/0657 257/777 |
| 2014/0252561 A1 | 9/2014 | Lisk | |
| 2014/0264840 A1* | 9/2014 | Lin | H01L 21/563 257/737 |
| 2014/0273348 A1* | 9/2014 | Yim | H01L 23/10 438/107 |
| 2014/0291868 A1* | 10/2014 | Lee | H05K 1/0271 257/777 |
| 2015/0084170 A1 | 3/2015 | Im | |
| 2015/0091179 A1 | 4/2015 | Shenoy | |
| 2015/0123289 A1 | 5/2015 | Park | |
| 2015/0130078 A1 | 5/2015 | Hong | |
| 2015/0187723 A1* | 7/2015 | Huang | H01L 24/16 257/738 |
| 2015/0318266 A1 | 11/2015 | Jang | |
| 2016/0013155 A1* | 1/2016 | Chung | H01L 25/50 257/659 |
| 2016/0027764 A1 | 1/2016 | Kim | |
| 2016/0056057 A1* | 2/2016 | Yu | H01L 23/5389 257/774 |
| 2016/0064255 A1 | 3/2016 | Otremba | |
| 2016/0118372 A1 | 4/2016 | Lin | |
| 2016/0133613 A1* | 5/2016 | Seo | H01L 23/481 257/686 |
| 2016/0172337 A1 | 6/2016 | Kim | |
| 2016/0322339 A1* | 11/2016 | Huang | H01L 23/49816 |
| 2016/0334845 A1 | 11/2016 | Mittal | |
| 2017/0117208 A1 | 4/2017 | Kasztelan | |
| 2017/0117261 A1* | 4/2017 | Yu | H01L 21/4846 |
| 2017/0133354 A1* | 5/2017 | Chen | H01L 25/0657 |
| 2017/0160955 A1 | 6/2017 | Jayasena | |
| 2017/0229432 A1 | 8/2017 | Lin | |
| 2017/0278830 A1* | 9/2017 | Kim | H01L 25/50 |
| 2017/0287865 A1 | 10/2017 | Yu | |
| 2017/0338202 A1 | 11/2017 | Tsai | |
| 2017/0345804 A1* | 11/2017 | Jeng | H01L 21/4857 |
| 2018/0082988 A1* | 3/2018 | Cheng | H01L 21/561 |
| 2018/0102345 A1* | 4/2018 | Lin | H01L 25/0657 |
| 2018/0151546 A1* | 5/2018 | Lin | H01L 21/6835 |
| 2018/0166420 A1 | 6/2018 | Park | |
| 2018/0286793 A1* | 10/2018 | Cheng | H01L 24/03 |
| 2019/0006342 A1* | 1/2019 | Karhade | H01L 21/78 |
| 2019/0103385 A1* | 4/2019 | Karhade | H01L 23/3737 |
| 2021/0066155 A1* | 3/2021 | Nofen | H01L 23/373 |
| 2021/0066273 A1* | 3/2021 | Myasishchev | H01L 25/18 |

* cited by examiner

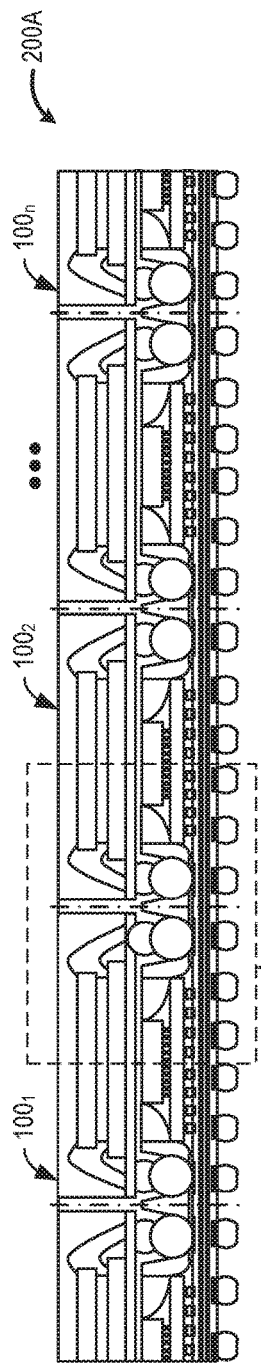
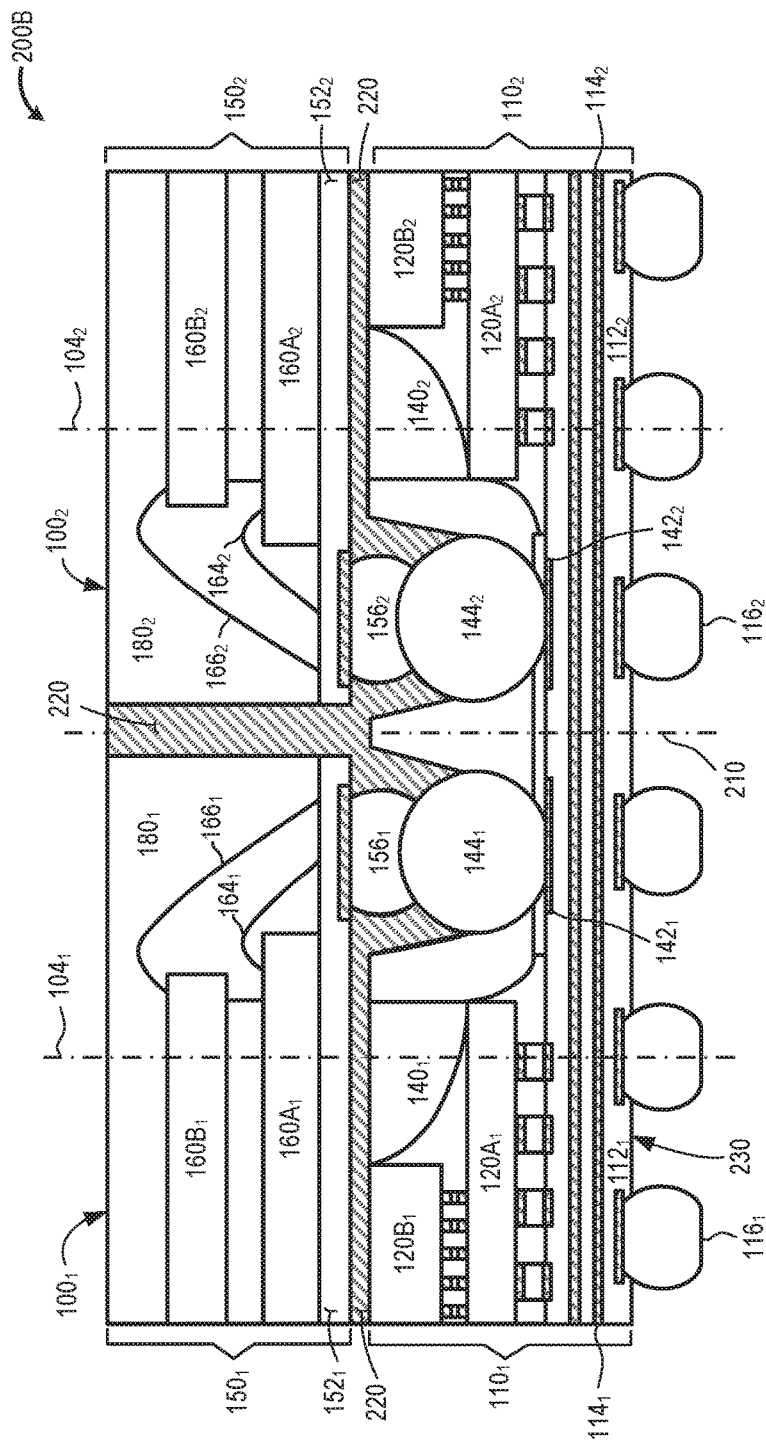
FIG. 2A
FIG. 2B

PACKAGE ON PACKAGE THERMAL TRANSFER SYSTEMS AND METHODS

CROSS REFERENCE TO RELATED APPLICATION

This application is a Continuation of U.S. patent application Ser. No. 15/639,640 filed Jun. 30, 2017, the contents of which are referenced herein in their entirety.

TECHNICAL FIELD

The present disclosure relates to semiconductor fabrication and the transfer of thermal energy within a package-on-package semiconductor package.

BACKGROUND

Package-on-package (PoP) is an integrated circuit packaging technology in which a number of ball grid array (BGA) packages are arranged vertically. PoP packaging beneficially reduces the board area occupied by individually semiconductor packages. PoP packaging also minimizes track length between components that frequently interoperate. Minimizing track length provides more rapid signal propagation, reduced noise, and reduced channel cross-talk. In assembly, PoP packaging permits the testing of individual components prior to stacking rather than after stacking (e.g., chip stacking), reducing rework since only known good components are used in the PoP package.

In a typical PoP integrated circuit a memory package is stacked with a logic package, such as a system-on-a-chip (SoC). Frequently, the stacked packages are stacked and then physically and conductively coupled via reforming. Since most semiconductor packages create heat when operating, heat produced by the semiconductor packages in the stack must be dissipated through a relatively small area. The reduced heat transfer within a PoP package leads to the formation of hot spots within the stack and, ultimately, to premature failure of the PoP package.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

FIG. 2A is a cross-sectional elevation of an illustrative strip that includes a plurality of PoP semiconductor packages separated by an interstitial space, each of which includes a respective one of a plurality of first semiconductor packages stacked with a respective one of a plurality of second semiconductor packages to form a gap therebetween, in accordance with at least one embodiment described herein;

FIG. 2B is a cross-sectional elevation of the indicated portion of the semiconductor strip depicted in FIG. 2A that more clearly depicts the cured molding compound present in the interstitial space between adjacent PoP semiconductor packages and in the gap between the first semiconductor package upper surface and the second semiconductor package lower surface, the cured molding compound physically and thermally couples each of the plurality of first semiconductor packages to a respective one of each of the plurality of second semiconductor packages, in accordance with at least one embodiment described herein;

Figure 1:
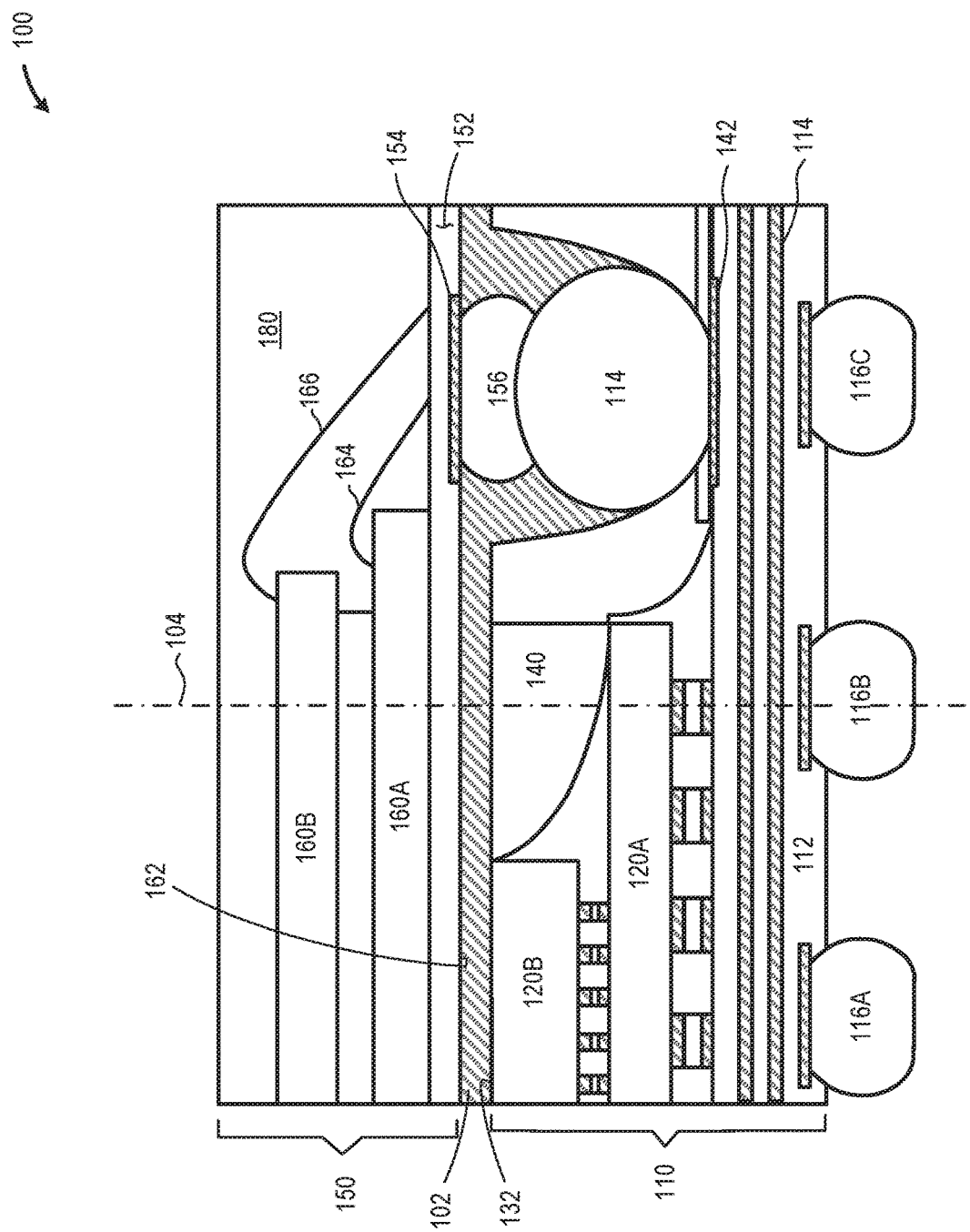
FIG. 1 is a cross-sectional elevation of an illustrative package-on-package (PoP) semiconductor package in which a first semiconductor package and a second semiconductor package are stacked forming a gap between the upper surface of the first semiconductor package and the lower surface of the second semiconductor package and in which a curable, flowable material, such as a molding compound, is flowed into the gap to thermally conductively couple the first semiconductor package to the second semiconductor package, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

The systems and methods disclosed herein provide for a package-on-package (PoP) construction using a material, such as a mold compound, disposed in a gap formed between the lower surface of the upper semiconductor package and the upper surface of the lower semiconductor package. Such construction may advantageously employ a material having a relatively high thermal conductivity when compared to conventional mold compounds. Filling the gap between the upper semiconductor package and the lower semiconductor package provides a thermally efficient stack that both: promotes a more even heat distribution across both the upper and lower package; and facilitates a more efficient heat removal from the lowermost semiconductor packages in the stack. Furthermore, the use of a free-flowing material to fill the gap between the semiconductor packages permits the use of smaller gaps (e.g., 20 micrometer (μm) to 60 μm) between the upper and lower semiconductor packages. Thus, the systems and methods described herein provide a significant advantage over capillary underfill systems which require larger gaps between non-singulated PoP package strips or arrays and which tend to detrimentally deposit the underfill material in the memory bump field disposed about the periphery of the memory package rather than between the semiconductor packages forming the stack.

The systems and methods described herein use an overmolded or exposed die molding process after memory attach to fill the gap between a first (i.e., lower) semiconductor package and the second (i.e., memory or upper) semiconductor package. The second semiconductor package may be attached to the first semiconductor package using mass reflow or thermal compression bonding at the strip level. In embodiments, the upper semiconductor package may be undersized (i.e., have a smaller surface area than the lower semiconductor package) to provide an additional margin of safety during the singulation or sawing process. The strip may be molded such that the top of the second semiconductor package remains visible, minimizing the z-height of the resultant PoP package. The top of the memory may be marked and the PoP packages included in the strip may be singulated.

Generally, the systems and methods described herein provide greater thermal conductivity in the z-direction than PoP packages in which a gap is present between the upper and lower semiconductor packages. The systems and methods described herein also provide more uniform heat spreading across the PoP package. The systems and methods described herein also advantageously provide a PoP package having an overall lower z-height than overmolded PoP packages. Furthermore, the systems and methods described herein advantageously permit greater PoP package density on the strip due to the superior flowability of mold compound and the resultant ability of the mold compound to flow in narrower spaces than capillary underfill process.

A semiconductor package-on-package system is provided. The system may include: a first package having a top surface and a bottom surface, wherein at least a portion of the first package top surface includes an exposed die; and a second package having a top surface and a bottom surface; the second package communicably coupled to the first package; wherein a gap exists between the second package bottom surface and the first package top surface; and wherein the gap is filled with a hardened flowable material to thermally conductively couple the top surface of the first package to the bottom surface of the second package.

A semiconductor package-on-package manufacturing method is provided. The method may include: communicably coupling a first package and a second package to provide a gap between a lower surface of the second package and an upper surface of the first package, wherein the first package includes an exposed die forming at least a portion of the upper surface of the first package; and flowing a material in the gap between the lower surface of the second package and the upper surface of the first package to thermally conductively couple the upper surface of the first package to the lower surface of the second package.

A semiconductor package-on-package (PoP) manufacturing method is provided. The method may include: forming a plurality of package-on-package semiconductors on a strip, each of the plurality of PoP semiconductors separated from an adjacent PoP semiconductor by a lateral gap, by: communicably coupling each of a plurality of first packages to a respective one of each of a plurality of second packages to provide a gap between a lower surface of each of the plurality of second packages and a respective one of each of the plurality of first packages, wherein each of the plurality of first packages includes an exposed die forming at least a portion of the upper surface of the respective package; flowing the material in the lateral gap between each of the plurality of PoP semiconductors and in the gap between the lower surface of each of the plurality of second packages and the upper surface of each of the plurality of first packages to thermally conductively couple the upper surface of each of the plurality of first packages to the lower surface of a corresponding one of the plurality of second packages; and singulating the plurality of PoP semiconductors to provide a plurality of singulated POP semiconductors.

An electronic device that includes at least one package-on-package (PoP) semiconductor package is provided. The device may include: at least one enhanced thermal performance semiconductor package-on-package system that includes: a first package having a top surface and a bottom surface, wherein at least a portion of the first package top surface includes an exposed die; and a second package having a top surface and a bottom surface; the second package communicably coupled to the first package; where a gap exists between the second package bottom surface and the first package top surface; and where the gap is filled with a hardened flowable material to thermally conductively couple the top surface of the first package to the bottom surface of the second package.

An enhanced thermal performance semiconductor package-on-package (PoP) manufacturing system. The system may include: a means for communicably coupling a first package and a second package to provide a gap between a lower surface of the second package and an upper surface of the first package, wherein the first package includes an exposed die forming at least a portion of the upper surface of the first package; and a means for flowing a material in the gap between the lower surface of the second package and the upper surface of the first package to thermally conductively couple the upper surface of the first package to the lower surface of the second package.

A semiconductor package-on-package (PoP) strip manufacturing system is provided. The system may include: a means for forming a plurality of package-on-package semiconductors on a strip, each of the plurality of PoP semiconductors separated from an adjacent PoP semiconductor by a lateral gap, by: means for communicably coupling each of a plurality of first packages to a respective one of each of a plurality of second packages to provide a gap between a lower surface of each of the plurality of second packages and a respective one of each of the plurality of first packages, wherein each of the plurality of first packages includes an exposed die forming at least a portion of the upper surface of the respective package; a means for flowing the material in the lateral gap between each of the plurality of PoP semiconductors and in the gap between the lower surface of each of the plurality of second packages and the upper surface of each of the plurality of first packages to thermally conductively couple the upper surface of each of the plurality of first packages to the lower surface of a corresponding one of the plurality of second packages; and a means for singulating the plurality of PoP semiconductors to provide a plurality of singulated PoP semiconductors.

As used herein the terms "top," "bottom," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

As used herein, the term "logically associated" when used in reference to a number of objects, systems, or elements, is intended to convey the existence of a relationship between the objects, systems, or elements such that access to one object, system, or element exposes the remaining objects, systems, or elements having a "logical association" with or to the accessed object, system, or element. An example "logical association" exists between relational databases where access to an element in a first database may provide information and/or data from one or more elements in a number of additional databases, each having an identified relationship to the accessed element. In another example, if "A" is logically associated with "B," accessing "A" will expose or otherwise draw information and/or data from "B," and vice-versa.

FIG. 1 is a cross-sectional elevation of an illustrative package-on-package (PoP) semiconductor package 100 in which a first semiconductor package 110 and a second semiconductor package 150 are stacked forming an interstitial space or gap between the upper surface 132 of the first semiconductor package 110 and the lower surface 162 of the second semiconductor package 150 and in which a molding compound 102 is flowed into the gap to thermally conductively couple the first semiconductor package 110 to the second semiconductor package 150, in accordance with at least one embodiment described herein. The disclosed PoP packaging, including a non-overmolded second semiconductor package 150, beneficially reduces the overall z-height 104 of the PoP package 100, thereby facilitating a thinner electronic device housing. Additionally, the PoP packaging as described herein beneficially reduces the required board area, thereby facilitating a smaller electronic device housing.

The first semiconductor package 110 may include a stacked die semiconductor package that includes any number of stacked semiconductor dies 120A-120n (collectively, "semiconductor dies 120"). As depicted in FIG. 1, the first semiconductor package 110 includes a first semiconductor die 120A and a second semiconductor die 120B. In some embodiments, the first semiconductor package 110 may include a stacked die semiconductor package in which the top or uppermost semiconductor die 120n is at least partially exposed, i.e., an exposed die semiconductor package. In some embodiments, the first semiconductor package 110 may include an overmolded stacked semiconductor die package. The first semiconductor package 110 includes a substrate 112 having any number of layers that include one or more conductive traces 114 on which the semiconductor dies 120 are physically mounted and to which at least some of the semiconductor dies 120 are communicably and conductively coupled.

The second semiconductor package 150 may also include a stacked die semiconductor package that includes any number of stacked semiconductor dies 160A-160n (collectively, "semiconductor dies 160"). As depicted in FIG. 1, the second semiconductor package 150 includes a first semiconductor die 160A stacked with a second semiconductor die 160B. A plurality of conductors 164 (wire bonds, solder bumps, etc.) connect the first semiconductor die 160A to conductive pads 154 disposed on the substrate 152 of the second semiconductor package 150. Similarly, a plurality of conductors 166 (wire bonds, solder bumps, etc.) communicably couple the second semiconductor die 160B to conductive pads 154 disposed on the substrate 152 of the second semiconductor package 150. In embodiments, the second semiconductor package 150 may be partially or completely encapsulated in molding compound 180. Although not depicted in FIG. 1, in embodiments, the second semiconductor package 150 may include an exposed die semiconductor package in which the second semiconductor die 160B forms at least a portion of the upper surface of the second semiconductor package 150.

The first semiconductor package 110 and the second semiconductor package 150 are conductively and communicably coupled using a plurality of conductive structures. As depicted in FIG. 1, a plurality of solder balls 144 may be disposed on a respective plurality of pads 142 disposed in, on, or about the first semiconductor package substrate 112 and a plurality of solder balls 156 may be disposed on a respective plurality of conductive pads 154 disposed in, on, or about the second semiconductor package substrate 152. In embodiments, a reflow or similar process may be used to conductively couple the first semiconductor package 110 to the second semiconductor package 150 via the solder balls 144 and 156. After coupling the first semiconductor package 110 to the second semiconductor package 150, a gap exists between the upper surface 132 of the first semiconductor package 110 and the lower surface 162 of the second semiconductor package 150.

Left unfilled, the air-filled gap between the first semiconductor package 110 and the second semiconductor package 150 limits heat transfer from the first semiconductor package 110 to the second semiconductor package 150. Flowing a molding compound 102 into the gap such that, when cured, the molding compound 102 thermally conductively couples the first semiconductor package 110 to the second semiconductor package 150 beneficially improves heat distribution across the upper surface 132 of the first semiconductor package 110 and beneficially increases the heat transfer from the first semiconductor package 110 to the second semiconductor package 150. In embodiments, the molding compound 102 may have a higher thermal conductivity than the molding compound 180 used to encapsulate the second semiconductor package 150 to further enhance the heat transfer from the first semiconductor package 110 and the heat distribution across the upper surface 132 of the first semiconductor package 110.

The first semiconductor package 110 may include any number and/or combination of semiconductor dies 120A-120n. In embodiments, the semiconductor dies 120 forming the first semiconductor package 110 may include: a system-in-a-package (SiP); a system-on-a-chip (SoC); an application specific integrated circuit (ASIC); a reduced instruction set computer (RISC); a digital signal processor (DSP); a programmable gate array (PGA); or any other device, collection of devices and/or system capable of executing machine readable instructions and accessing one or more storage devices. The first semiconductor package 110 may have any physical size, shape or configuration.

As depicted in FIG. 1, in embodiments, the first semiconductor package 110 may be fabricated using an exposed die molding process in which the semiconductor dies 120 are surrounded by a molding compound 140. In such an embodiment, the uppermost semiconductor die 120n remains at least partially exposed after curing the molding compound 140, thereby forming a portion of the upper surface 132 of the first semiconductor package 110.

The second semiconductor package 150 may include any number and/or combination of semiconductor dies 160A-160n. In embodiments, the semiconductor dies 160 forming the second semiconductor package 150 may include, but is not limited to: a low power double data rate (LPDDR1, LPDDR2, LPDDR3, LPDDR4) random access memory; a low power standard data rate (LPSDR) random access memory; a 3D NAND; a universal flash storage (UFS) memory; an embedded multi-media controller (e.MMC); or combinations thereof. The second semiconductor package 150 may have any physical size, shape, or configuration. In some embodiments, the second semiconductor package 150 may occupy a physically smaller area than the first semiconductor package 110. For example, the surface area of the lower surface 162 of the second semiconductor package 150 may be less than the surface area of the upper surface 132 of the first semiconductor package 110. The first semiconductor package 110 and the second semiconductor package 150 may be physically, communicably and conductively coupled using mass reflow or thermal compression bonding. Example mass reflow techniques include, but are not limited to: forced convection; infrared radiation; vapor phase; laser; hot bar; or any combination thereof.

The molding compound 102 disposed in the gap between the first semiconductor package 110 and the second semiconductor package 150 may include any material or combination of materials. In embodiments, the mold compound may include at least one of: one or more elastomers, one or more thermoplastics, one or more thermosetting plastics, one or silicone molding compounds, or combinations thereof. Example elastomers include, but are not limited to: silicone, polyurethane, chloroprene, butyl, polybutadiene, neoprene, natural rubber or isoprene, and other synthetic rubber or compounds. The molding compound 102 may be a composite material that includes a combination of: epoxy resins, phenolic hardeners, silicas, catalysts, pigments, and mold release agents. In some implementations, the molding compound 102 may include one or more materials capable of increasing the thermal conductivity (k, watts per meter-kelvin, W/(m·K)). In some implementations, the molding compound 102 may have a thermal conductivity greater than the thermal conductivity of the molding compound 180 used to encapsulate the second semiconductor package 150.

Figure 2C:
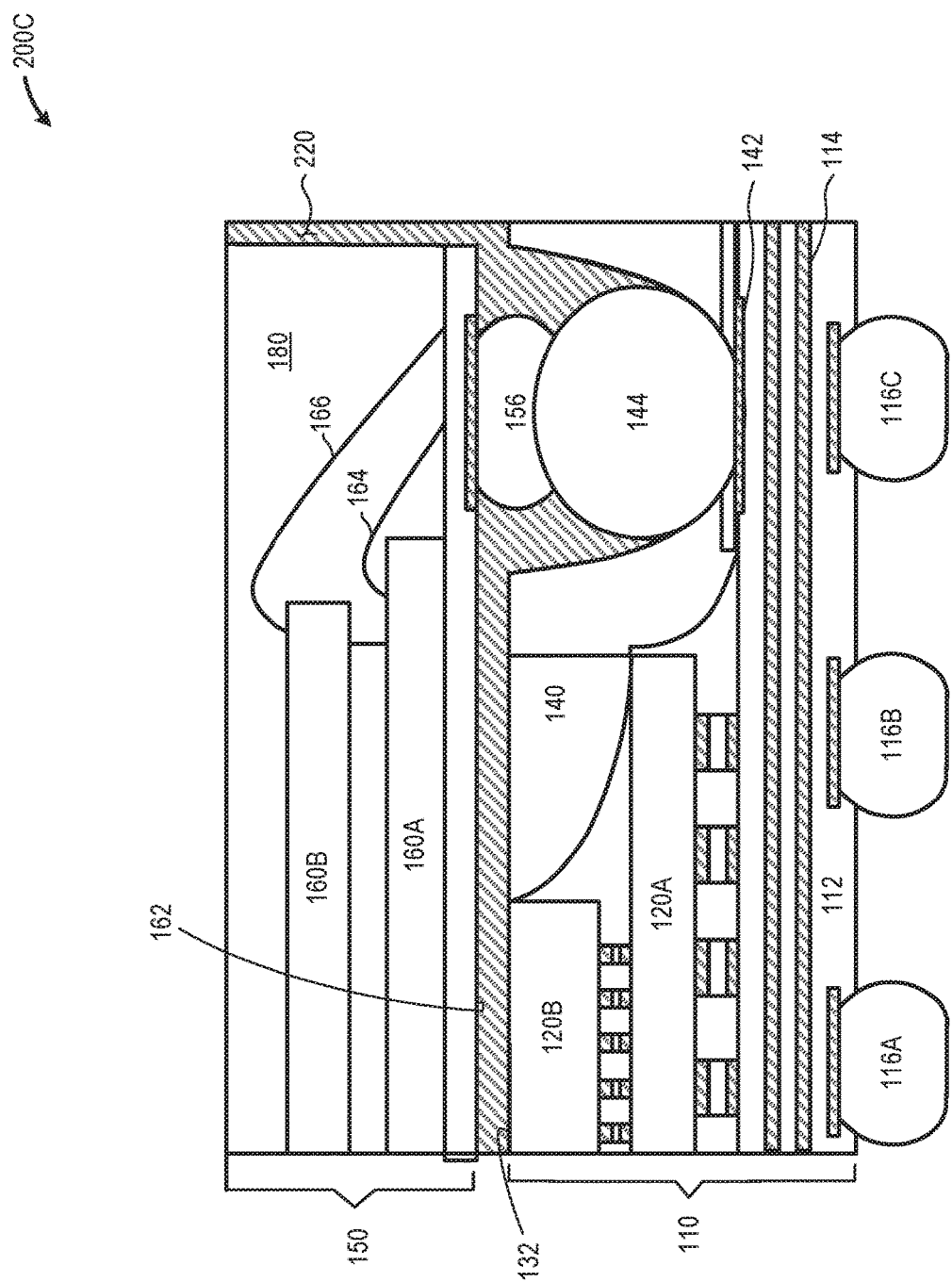
FIG. 2C is a cross-sectional elevation of a singulated PoP semiconductor package such as depicted in FIG. 2A and FIG. 2B, in accordance with at least one embodiment described herein.

FIG. 2A is a cross-sectional elevation of an illustrative strip 200A that includes a plurality of PoP semiconductor packages $100_1$-$100_n$ (collectively, "PoP semiconductor packages 100"), each of which includes a respective one of a plurality of first semiconductor packages $110_1$-$110_n$ (collectively, "first semiconductor packages 110") stacked with a respective one of a plurality of second semiconductor packages $150_1$-$150_n$ (collectively, "second semiconductor packages 150"), in accordance with at least one embodiment described herein. FIG. 2B is a cross-sectional elevation of the indicated portion of the semiconductor strip depicted in FIG. 2A that more clearly depicts the cured molding compound 220 present in the interstitial space or gap between each of the first semiconductor packages 110 and second semiconductor packages 150, the cured molding compound physically and thermally couples each of the plurality of first semiconductor packages 110 to a respective one of each of the plurality of second semiconductor packages 150, in accordance with at least one embodiment described herein. FIG. 2C is a cross-sectional elevation of a singulated PoP semiconductor package 100 such as depicted in FIG. 2A and FIG. 2B, in accordance with at least one embodiment described herein.

In embodiments, the first semiconductor packages 110 may be disposed on all or a portion of a panel or a portion of a panel 230 providing the substrate 112 for each of the PoP semiconductor packages 100. As depicted in FIGS. 2A-2C, a liquid or fluid molding compound 220 is flowed between the Molding compound 220 is introduced to the spaces between the semiconductor packages 100 on the strip and flows both around and between the semiconductor packages and into the gaps between the first semiconductor package 110 and the second semiconductor package 150. In embodiments, the molding compound 220 may cover or overmold the second semiconductor package 150. In other embodiments, the molding compound 220 may be disposed approximately level with the upper surface of the second semiconductor package 150, leaving the upper surface of the second semiconductor package 150 to form at least portion of the completed PoP semiconductor package 100. Allowing the upper surface of the second semiconductor package 150 to remain exposed beneficially provides guide lines for sawing or singulating the PoP semiconductor packages 100.

In embodiments, the molding compound 220 may be selected, in part, based on the flowability and/or surface tension of the uncured, fluid, molding compound 220. Such permits the fluid molding compound to penetrate the gap between the first semiconductor package 110 and the second semiconductor package 150 and fill the interstitial spaces between each of the PoP semiconductor packages 100 on the strip. Upon curing, the molding compound 220 protectively encapsulates the perimeter of the PoP semiconductor package 100 and assists in physically coupling the first semiconductor package 110 to the second semiconductor package 150. In embodiments, after disposing the molding compound 220 between the first semiconductor package 110 and the second semiconductor package 150 and between the PoP semiconductor packages 100 on the strip 230, the PoP semiconductor packages 100 can be singulated, for example along cut line 210.

Figure 3:
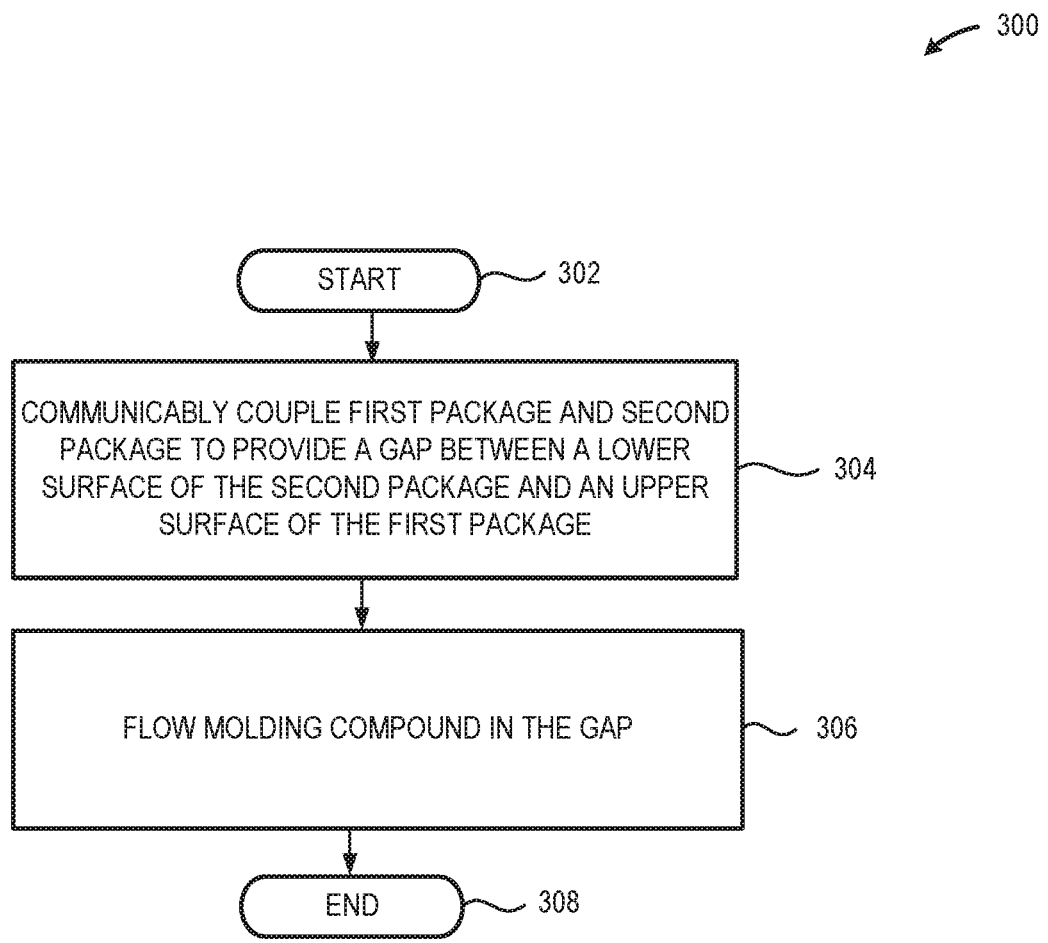
FIG. 3 is a high-level logic flow diagram of an illustrative method for manufacturing a PoP semiconductor package having enhanced thermal performance, in accordance with at least one embodiment described herein.

FIG. 3 is a high-level logic flow diagram of an illustrative method 300 for manufacturing a PoP semiconductor package 100 having enhanced thermal performance, in accordance with at least one embodiment described herein. The PoP semiconductor package 100 includes a first semiconductor package 110 and a stacked second semiconductor package 150 with a gap of approximately 20 nanometers to 60 nanometers separating the upper surface 132 of the first semiconductor package 110 and the lower surface 162 of the second semiconductor package 150. The first semiconductor package 110 may include an exposed die semiconductor package. A molding compound 102 is flowed into the gap between the first semiconductor package 110 and the second semiconductor package 150. The cured molding compound 102 distributes the heat generated by hot spots on the upper surface 132 of the first semiconductor package 110 across the x-y plane formed by the upper surface of the first semiconductor package 110. The cured molding compound further facilitates the transfer of heat generated by the first semiconductor package 110 to the second semiconductor package 150 and then to the environment surrounding the PoP semiconductor package 100. The method 300 commences at 302.

At 304 a first semiconductor package 110 is conductively and communicably coupled to a second semiconductor package 150. In some implementations, the first semiconductor package 110 and second semiconductor package 150 may be conductively coupled using solder balls and a reflow process. In embodiments, the first semiconductor package 110 may include a system-on-a-chip (SoC) having a die stack in which the uppermost die 120B remains exposed (i.e., an exposed die package). In embodiments, the second semiconductor package 150 may include a memory package having a die stack encased in mold compound 180. After coupling the first semiconductor package 110 to the second semiconductor package 150, a gap of about 20 nanometers (nm) to about 60 nm is created between the upper surface 132 of the first semiconductor package 110 and the lower surface 162 of the second semiconductor package 150.

At 306 a fluid material, such as an uncured molding compound 102, is flowed into the gap formed by the upper surface 132 of the first semiconductor package 110 and the lower surface 162 of the second semiconductor package 150. The cured molding compound 102 beneficially physically couples the first semiconductor package 110 to the second semiconductor package 150, improving the physical integrity of the PoP semiconductor package 100. The cured molding compound 102 also beneficially improves heat distribution across the upper surface 132 of the first semiconductor package 110. The cured molding compound 102 also improves the transfer of thermal energy produced by the first semiconductor package 110 to the second semiconductor package 150. The method 300 concludes at 308.

Figure 4:
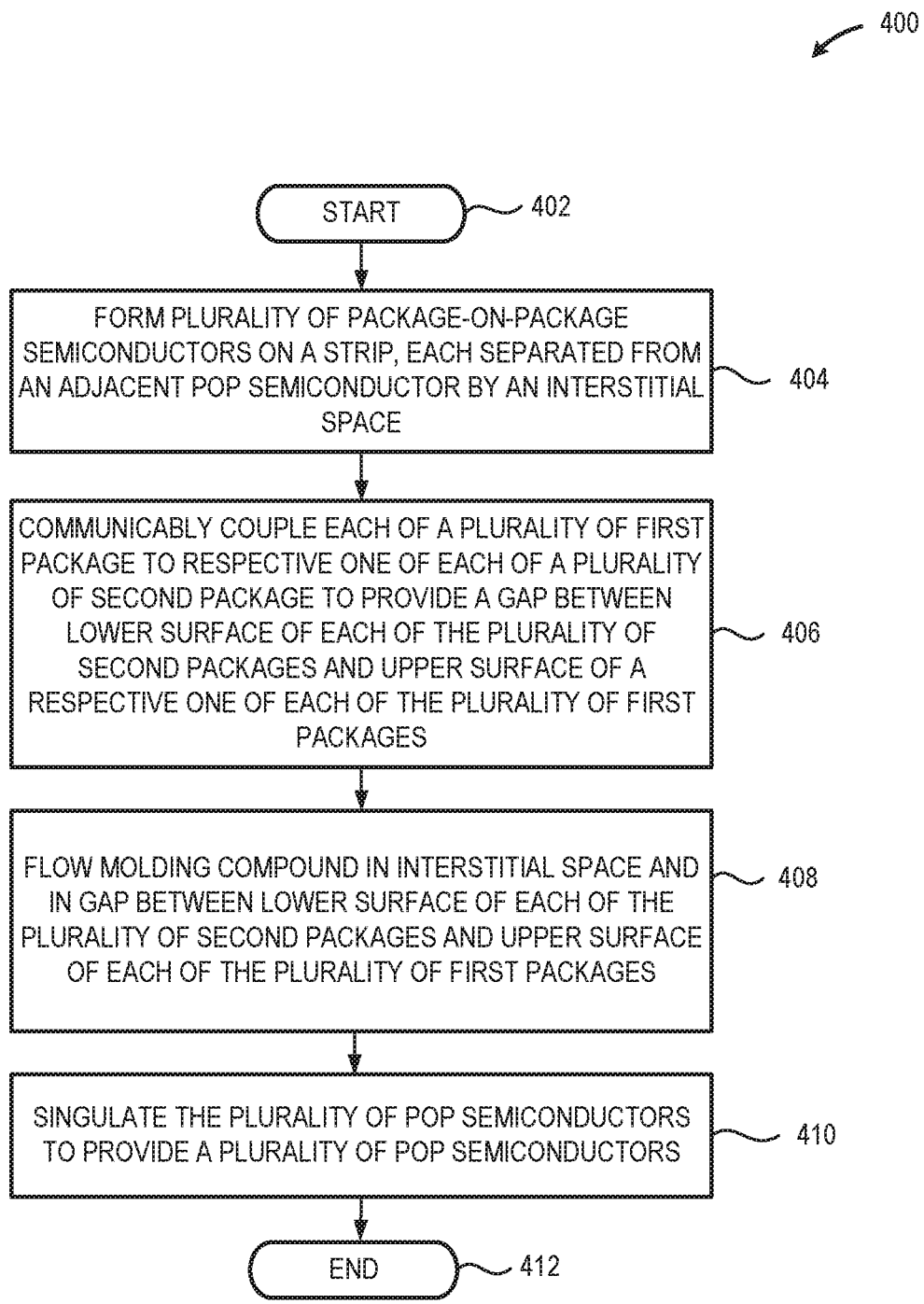
FIG. 4 is a high-level logic flow diagram of an illustrative method for manufacturing a plurality PoP semiconductor packages having an enhanced thermal performance, in accordance with at least one embodiment described herein.

FIG. 4 is a high-level logic flow diagram of an illustrative method 400 for manufacturing a plurality PoP semiconductor packages 100A-100n having an enhanced thermal performance, in accordance with at least one embodiment described herein. Each of the plurality of PoP semiconductor packages 100 includes a first semiconductor package 110 and a stacked second semiconductor package 150 with a gap of approximately 20 nanometers to 60 nanometers separating the upper surface 132 of the first semiconductor package 110 and the lower surface 162 of the second semiconductor package 150. In embodiments, the plurality of PoP semiconductor packages 100 may be fabricated on a substrate, such as an organic substrate 230. The use of a fluid material, such as an uncured molding compound 220, allows the placement of each PoP semiconductor package 100 closely proximate neighboring PoP semiconductor packages since the fluid molding compound is able to penetrate relatively small interstitial spaces or gaps between the PoP semiconductor packages as well as the gap between the first semiconductor package 110 and the second semiconductor package 150 in each of the PoP semiconductor packages 100. The plurality of PoP semiconductor packages 100 may be singulated after curing the molding compound 220. The method 400 commences at 402.

At 404, a plurality of PoP semiconductor packages 100A-100n are formed on a substrate 230. The substrate 230 may include an organic substrate having a plurality of conductive and dielectric layers. Each of the plurality of PoP semiconductor packages 100 are separated by an interstitial space or gap from neighboring PoP semiconductor packages.

At 406, each of the PoP semiconductor packages 100 is formed by communicably and conductively coupling a first semiconductor package 110 with a second semiconductor package 150. In some implementations, the first semiconductor package 110 and second semiconductor package 150 may be conductively coupled using solder balls and a reflow process. In embodiments, the first semiconductor package 110 may include a system-on-a-chip (SoC) having a die stack in which the uppermost die 120B remains exposed (i.e., an exposed die package). In embodiments, the second semiconductor package 150 may include a memory package having a die stack encased in mold compound 180. After coupling the first semiconductor package 110 to the second semiconductor package 150, a gap of about 20 nanometers (nm) to about 60 nm is created between the upper surface 132 of the first semiconductor package 110 and the lower surface 162 of the second semiconductor package 150.

At 408 a fluid material, such as an uncured molding compound 220, is flowed in the interstitial spaces between each of the PoP semiconductor packages 100 and into the gap formed by the upper surface 132 of the first semiconductor package 110 and the lower surface 162 of the second semiconductor package 150 in each of the plurality of PoP semiconductor packages 100.

In embodiments, the upper surface of the cured molding compound 220 may be level with the upper surface of the second semiconductor package 150, such that the upper surface of the second semiconductor package 150 forms a portion of the upper surface of the PoP semiconductor package 100. In other embodiments, the upper surface of the cured molding compound 220 may cover the upper surface of the second semiconductor package 150, encapsulating the PoP semiconductor package 100.

The cured molding compound 102 beneficially physically couples the first semiconductor package 110 to the second semiconductor package 150, improving the physical integrity of the PoP semiconductor package 100. The cured molding compound 102 also beneficially improves heat distribution across the upper surface 132 of the first semiconductor package 110. The cured molding compound 102 also improves the transfer of thermal energy produced by the first semiconductor package 110 to the second semiconductor package 150. The method 300 concludes at 308.

At 410, the plurality of PoP semiconductor packages 100A-100n disposed across the surface of the substrate 230 strip are separated, for example via sawing or similar cutting devices, to provide a plurality of individual PoP semiconductor packages 100. In embodiments, where the second semiconductor package 150 remains exposed (i.e., where the upper surface of the cured molding compound 220 is at or below the level of the upper surface of the second semiconductor package 150), the second semiconductor packages 150 provide guides to singulate the PoP semiconductor packages 100. The method 400 concludes at 412.

While FIGS. 3 and 4 illustrate various operations according to one or more embodiments, it is to be understood that not all of the operations depicted in FIGS. 3 and 4 are necessary for other embodiments. Indeed, it is fully contemplated herein that in other embodiments of the present disclosure, the operations depicted in FIGS. 3 and 4, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

As used in any embodiment herein, the terms "system" or "module" may refer to, for example, software, firmware and/or circuitry configured to perform any of the aforementioned operations. Software may be embodied as a software package, code, instructions, instruction sets and/or data recorded on non-transitory computer readable storage mediums. Firmware may be embodied as code, instructions or instruction sets and/or data that are hard-coded (e.g., nonvolatile) in memory devices. "Circuitry", as used in any embodiment herein, may comprise, for example, singly or in any combination, hardwired circuitry, programmable circuitry such as computer processors comprising one or more individual instruction processing cores, state machine circuitry, and/or firmware that stores instructions executed by programmable circuitry or future computing paradigms including, for example, massive parallelism, analog or quantum computing, hardware embodiments of accelerators such as neural net processors and non-silicon implementations of the above. The circuitry may, collectively or individually, be embodied as circuitry that forms part of a larger system, for example, an integrated circuit (IC), system on-chip (SoC), desktop computers, laptop computers, tablet computers, servers, smartphones, etc.

Any of the operations described herein may be implemented in a system that includes one or more mediums (e.g., non-transitory storage mediums) having stored therein, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), rewritable compact disks (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eMMCs), secure digital input/output (SDIO) cards, magnetic or optical cards, or any type of media suitable for storing electronic instructions. Other embodiments may be implemented as software executed by a programmable control device.

Thus, the present disclosure is directed to systems and methods for improving heat distribution and heat removal efficiency in PoP semiconductor packages. A PoP semiconductor package includes a first semiconductor package that is physically, communicably, and conductively coupled to a stacked second semiconductor package. The first semiconductor package may include a die stack in which the uppermost die remains exposed (i.e., the first semiconductor package may be an exposed die package). The second semiconductor package may include a die stack in which all dies are encapsulated in molding compound. A gap forms between the upper surface of the first semiconductor package and the lower surface of the second semiconductor package. Additionally, interstitial gaps form between each of the PoP semiconductor packages disposed on an organic substrate. A fluid, uncured, molding compound may be flowed both in the interstitial spaces between the PoP semiconductor packages and into the gap between the upper surface of the first semiconductor package and the lower surface of the second semiconductor package. The substrate containing the plurality of PoP semiconductor packages may be singulated to provide a plurality of individual PoP semiconductor packages. The presence of the cured molding compound in the gap between the first semiconductor package and the second semiconductor package beneficially and advantageously distributes heat across the upper surface of the first semiconductor package and enhances thermal flow from the first semiconductor package to the second semiconductor package.

The following examples pertain to further embodiments. The following examples of the present disclosure may comprise subject material such as at least one device, a method, at least one machine-readable medium for storing instructions that when executed cause a machine to perform acts based on the method, means for performing acts based on the method and/or a system for improving and enhancing lateral heat distribution across the upper surface of a first semiconductor package in a PoP semiconductor package and improving and enhancing the flow of heat from a first semiconductor package to a second semiconductor package within a PoP semiconductor package.

According to example 1, there is provided an enhanced thermal performance semiconductor package-on-package system. The system may include: a first package having a top surface and a bottom surface, wherein at least a portion of the first package top surface includes an exposed die; and a second package having a top surface and a bottom surface; the second package communicably coupled to the first package; wherein a gap exists between the second package bottom surface and the first package top surface; and wherein the gap is filled with a hardened flowable material to thermally conductively couple the top surface of the first package to the bottom surface of the second package.

Example 2 may include elements of example 1 where the at least one first semiconductor package includes a die stack and wherein at least a portion of the first package top surface may include an exposed uppermost die in the die stack.

Example 3 may include elements of example 2 where the at least one first semiconductor package includes a system on a chip (SoC).

Example 4 may include elements of example 3 where the second package comprises one or more memory dies encapsulated in a mold compound having a first thermal conductivity.

Example 5 may include elements of example 4 where the hardened flowable material comprises an electrically non-conductive material having a second thermal conductivity, the second thermal conductivity greater than the first thermal conductivity.

Example 6 may include elements of example 1 where, in operation, a thermal output of the first package exceeds a thermal output of the second package.

Example 7 may include elements of example 1 where the first package top surface comprises a surface having a first area and the second package bottom surface comprises a surface having a second area, the second area less than the first area.

According to example 8, there is provided an enhanced thermal performance semiconductor package-on-package manufacturing method. The method may include: communicably coupling a first package and a second package to provide a gap between a lower surface of the second package and an upper surface of the first package, wherein the first package includes an exposed die forming at least a portion of the upper surface of the first package; and flowing a material in the gap between the lower surface of the second package and the upper surface of the first package to thermally conductively couple the upper surface of the first package to the lower surface of the second package.

Example 9 may include elements of example e8 where communicably coupling a first package and a second package to provide a gap between a lower surface of the second package and an upper surface of the first package may include: communicably coupling a first package and a second package to provide a gap between a lower surface of the second package and an upper surface of the first package; where the first package includes a die stack; and where the exposed die forming at least a portion of the upper surface of the first package includes the uppermost die in the die stack.

Example 10 may include elements of example 9 where communicably coupling a first package and a second package to provide a gap between a lower surface of the second package and an upper surface of the first package may include: communicably coupling a first package and a second package to provide a gap between a lower surface of the second package and an upper surface of the first package; where the first package includes a system on a chip (SoC).

Example 11 may include elements of example 10 where communicably coupling a first package and a second package to provide a gap between a lower surface of the second package and an upper surface of the first package may include: communicably coupling a first package and a second package to provide a gap between a lower surface of the second package and an upper surface of the first package;

where the second package comprises one or more memory dies encapsulated in a mold compound having a first thermal conductivity.

Example 12 may include elements of example 8 where flowing a material in the gap between the lower surface of the second package and the upper surface of the first package may include: flowing a material in the gap between the lower surface of the second package and the upper surface of the first package wherein the material comprises an electrically non-conductive material having a second thermal conductivity, the second thermal conductivity greater than the first thermal conductivity.

Example 13 may include elements of example 8 where communicably coupling a first package and a second package to provide a gap between a lower surface of the second package and an upper surface of the first package may include: communicably coupling a first package and a second package to provide a gap between a lower surface of the second package and an upper surface of the first package; where the first package top surface comprises a surface having a first area and the second package bottom surface comprises a surface having a second area, the second area less than the first area.

According to example 14, there is provided an enhanced thermal performance semiconductor package-on-package manufacturing method may include: forming a plurality of package-on-package semiconductors on a strip, each of the plurality of POP semiconductors separated from an adjacent POP semiconductor by a lateral gap, by: communicably coupling each of a plurality of first packages to a respective one of each of a plurality of second packages to provide a gap between a lower surface of each of the plurality of second packages and a respective one of each of the plurality of first packages, wherein each of the plurality of first packages includes an exposed die forming at least a portion of the upper surface of the respective package; flowing the material in the lateral gap between each of the plurality of POP semiconductors and in the gap between the lower surface of each of the plurality of second packages and the upper surface of each of the plurality of first packages to thermally conductively couple the upper surface of each of the plurality of first packages to the lower surface of a corresponding one of the plurality of second packages; and singulating the plurality of POP semiconductors to provide a plurality of singulated POP semiconductors.

Example 15 may include elements of example 14 where communicably coupling each of a plurality of first packages to a respective one of each of a plurality of second packages to provide a gap between a lower surface of each of the plurality of second packages and a respective one of each of the plurality of first packages may include: communicably coupling each of a plurality of first packages to a respective one of each of a plurality of second packages to provide a gap between a lower surface of each of the plurality of second packages and a respective one of each of the plurality of first packages; where each of the plurality of first packages includes a die stack; and where the exposed die forming at least a portion of the upper surface of each of the plurality of first packages includes the uppermost die in the die stack.

Example 16 may include elements of example 15 where communicably coupling each of a plurality of first packages to a respective one of each of a plurality of second packages to provide a gap between a lower surface of each of the plurality of second packages and a respective one of each of the plurality of first packages may include: communicably coupling each of a plurality of first packages to a respective one of each of a plurality of second packages to provide a gap between a lower surface of each of the plurality of second packages and a respective one of each of the plurality of first packages; where each of the plurality of first packages includes a system on a chip (SoC).

Example 17 may include elements of example 16 where communicably coupling each of a plurality of first packages to a respective one of each of a plurality of second packages to provide a gap between a lower surface of each of the plurality of second packages and a respective one of each of the plurality of first packages may include: communicably coupling each of a plurality of first packages to a respective one of each of a plurality of second packages to provide a gap between a lower surface of each of the plurality of second packages and a respective one of each of the plurality of first packages; where each of the plurality of second packages comprises one or more memory dies encapsulated in a mold compound having a first thermal conductivity.

Example 18 may include elements of example 14 where flowing a material in the gap between the lower surface of each of the plurality of second packages and the upper surface of each of the plurality of first packages to thermally conductively couple the upper surface of each of the plurality of first packages to the lower surface of a corresponding one of the plurality of second packages comprises: flowing a material in the gap between the lower surface of each of the plurality of second packages and the upper surface of each of the plurality of first packages to thermally conductively couple the upper surface of each of the plurality of first packages to the lower surface of a corresponding one of the plurality of second packages; where the material comprises an electrically non-conductive material having a second thermal conductivity, the second thermal conductivity greater than the first thermal conductivity.

Example 19 may include elements of example 14 where communicably coupling each of a plurality of first packages to a respective one of each of a plurality of second packages to provide a gap between a lower surface of each of the plurality of second packages and a respective one of each of the plurality of first packages may include: where communicably coupling each of a plurality of first packages to a respective one of each of a plurality of second packages to provide a gap between a lower surface of each of the plurality of second packages and a respective one of each of the plurality of first packages; where each of the plurality of first package upper surfaces comprises a surface having a first area and each of the plurality of second package lower surfaces comprises a surface having a second area, the second area less than the first area.

According to example 20, there is provided an electronic device. The device may include: at least one enhanced thermal performance semiconductor package-on-package system that includes: a first package having a top surface and a bottom surface, wherein at least a portion of the first package top surface includes an exposed die; and a second package having a top surface and a bottom surface; the second package communicably coupled to the first package; where a gap exists between the second package bottom surface and the first package top surface; and where the gap is filled with a hardened flowable material to thermally conductively couple the top surface of the first package to the bottom surface of the second package.

Example 21 may include elements of example 20 where the at least one first package includes a die stack and wherein at least a portion of the first package top surface includes an exposed uppermost die in the die stack.

Example 22 may include elements of example 20 where the at least one first package includes a system on a chip (SoC).

Example 23 may include elements of example 22 where the second package may include one or more memory dies encapsulated in a mold compound having a first thermal conductivity.

Example 24 may include elements of example 23 where the hardened flowable material comprises an electrically non-conductive material having a second thermal conductivity, the second thermal conductivity greater than the first thermal conductivity.

Example 25 may include elements of example 20 where, in operation, a thermal output of the first package exceeds a thermal output of the second package.

Example 26 may include elements of example 20 where the first package top surface comprises a surface having a first area and the second package bottom surface comprises a surface having a second area, the second area less than the first area.

Example 27 may include elements of example 20 where the electronic device comprises a portable electronic device selected from the group consisting of: a smartphone, a wearable processor-based device; a handheld processor-based device; and a portable gaming system.

According to example 28, there is provided an enhanced thermal performance semiconductor package-on-package manufacturing system. The system may include: a means for communicably coupling a first package and a second package to provide a gap between a lower surface of the second package and an upper surface of the first package, wherein the first package includes an exposed die forming at least a portion of the upper surface of the first package; and a means for flowing a material in the gap between the lower surface of the second package and the upper surface of the first package to thermally conductively couple the upper surface of the first package to the lower surface of the second package.

Example 29 may include elements of example 28 where the means for communicably coupling a first package and a second package to provide a gap between a lower surface of the second package and an upper surface of the first package may include: a means for communicably coupling a first package and a second package to provide a gap between a lower surface of the second package and an upper surface of the first package; wherein the first package includes a die stack; and wherein the exposed die forming at least a portion of the upper surface of the first package includes the uppermost die in the die stack.

Example 30 may include elements of example 29 where the means for communicably coupling a first package and a second package to provide a gap between a lower surface of the second package and an upper surface of the first package may include: a means for communicably coupling a first package and a second package to provide a gap between a lower surface of the second package and an upper surface of the first package; wherein the first package includes a system on a chip (SoC).

Example 31 may include elements of example 30 where the means for communicably coupling a first package and a second package to provide a gap between a lower surface of the second package and an upper surface of the first package may include: a means for communicably coupling a first package and a second package to provide a gap between a lower surface of the second package and an upper surface of the first package; wherein the second package comprises one or more memory dies encapsulated in a mold compound having a first thermal conductivity.

Example 32 may include elements of example 28 where the means for flowing a material in the gap between the lower surface of the second package and the upper surface of the first package may include: a means for flowing a material in the gap between the lower surface of the second package and the upper surface of the first package wherein the material comprises an electrically non-conductive material having a second thermal conductivity, the second thermal conductivity greater than the first thermal conductivity.

Example 33 may include elements of example 28 where communicably coupling a first package and a second package to provide a gap between a lower surface of the second package and an upper surface of the first package comprises: a means for communicably coupling a first package and a second package to provide a gap between a lower surface of the second package and an upper surface of the first package; wherein the first package top surface comprises a surface having a first area and the second package bottom surface comprises a surface having a second area, the second area less than the first area.

According to example 34, there is provided an enhanced thermal performance semiconductor package-on-package manufacturing system. The system may include: a means for forming a plurality of package-on-package semiconductors on a strip, each of the plurality of PoP semiconductors separated from an adjacent PoP semiconductor by a lateral gap, by: means for communicably coupling each of a plurality of first packages to a respective one of each of a plurality of second packages to provide a gap between a lower surface of each of the plurality of second packages and a respective one of each of the plurality of first packages, wherein each of the plurality of first packages includes an exposed die forming at least a portion of the upper surface of the respective package; a means for flowing the material in the lateral gap between each of the plurality of PoP semiconductors and in the gap between the lower surface of each of the plurality of second packages and the upper surface of each of the plurality of first packages to thermally conductively couple the upper surface of each of the plurality of first packages to the lower surface of a corresponding one of the plurality of second packages; and a means for singulating the plurality of PoP semiconductors to provide a plurality of singulated PoP semiconductors.

Example 35 may include elements of example 34 where the means for communicably coupling each of a plurality of first packages to a respective one of each of a plurality of second packages to provide a gap between a lower surface of each of the plurality of second packages and a respective one of each of the plurality of first packages may include: a means for communicably coupling each of a plurality of first packages to a respective one of each of a plurality of second packages to provide a gap between a lower surface of each of the plurality of second packages and a respective one of each of the plurality of first packages; wherein each of the plurality of first packages includes a die stack; and wherein the exposed die forming at least a portion of the upper surface of each of the plurality of first packages includes the uppermost die in the die stack.

Example 36 may include elements of example 35 where the means for communicably coupling each of a plurality of first packages to a respective one of each of a plurality of second packages to provide a gap between a lower surface of each of the plurality of second packages and a respective one of each of the plurality of first packages may include: means for communicably coupling each of a plurality of first packages to a respective one of each of a plurality of second packages to provide a gap between a lower surface of each of the plurality of second packages and a respective one of each of the plurality of first packages; wherein each of the plurality of first packages includes a system on a chip (SoC).

Example 37 may include elements of example 36 where the means for communicably coupling each of a plurality of first packages to a respective one of each of a plurality of second packages to provide a gap between a lower surface of each of the plurality of second packages and a respective one of each of the plurality of first packages may include: a means for communicably coupling each of a plurality of first packages to a respective one of each of a plurality of second packages to provide a gap between a lower surface of each of the plurality of second packages and a respective one of each of the plurality of first packages; wherein each of the plurality of second packages comprises one or more memory dies encapsulated in a mold compound having a first thermal conductivity.

Example 38 may include elements of example 34 where the means for flowing a material in the gap between the lower surface of each of the plurality of second packages and the upper surface of each of the plurality of first packages to thermally conductively couple the upper surface of each of the plurality of first packages to the lower surface of a corresponding one of the plurality of second packages may include: a means for flowing a material in the gap between the lower surface of each of the plurality of second packages and the upper surface of each of the plurality of first packages to thermally conductively couple the upper surface of each of the plurality of first packages to the lower surface of a corresponding one of the plurality of second packages; wherein the material comprises an electrically non-conductive material having a second thermal conductivity, the second thermal conductivity greater than the first thermal conductivity.

Example 39 may include elements of example 34 where the means for communicably coupling each of a plurality of first packages to a respective one of each of a plurality of second packages to provide a gap between a lower surface of each of the plurality of second packages and a respective one of each of the plurality of first packages may include: a means for communicably coupling each of a plurality of first packages to a respective one of each of a plurality of second packages to provide a gap between a lower surface of each of the plurality of second packages and a respective one of each of the plurality of first packages; wherein each of the plurality of first package upper surfaces comprises a surface having a first area and each of the plurality of second package lower surfaces comprises a surface having a second area, the second area less than the first area.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed:

1. A semiconductor device comprising:
   a first semiconductor package having a top surface and a bottom surface, the first semiconductor package including a first die over a second die, the first die having a bottom surface;
   a second semiconductor package having a top surface and a bottom surface, the second semiconductor package including one or more dies encapsulated in a molding compound having a first thermal conductivity; and
   at least one conductive structure electrically coupling the first semiconductor package with the second semiconductor package;
   wherein:
   a gap is present between the second semiconductor package bottom surface and the first semiconductor package top surface; and
   curable fluid material disposed in the gap formed between the second semiconductor package bottom surface and the first semiconductor package top surface, the curable fluid to thermally couple the top surface of the first semiconductor package to the bottom surface of the second semiconductor package;
   wherein the curable fluid material contacts the at least one conductive structure within the gap;
   wherein at least a portion of an upper surface formed by the curable fluid material is level with the upper surface of the second semiconductor package and the curable fluid material extends about a perimeter of the upper surface of the second semiconductor package such that the upper surface of the second semiconductor package forms at least a portion of the upper surface of the semiconductor device formed by the first semiconductor device and the second semiconductor device, and wherein the curable fluid material has a bottom surface below the top surface of the first semiconductor package and below the bottom surface of the first die of the first semiconductor package.

2. The device of claim 1, wherein the at least one conductive structure comprises:
   a first conductive structure on the top surface of the first semiconductor package; and
   a second conductive structure on the bottom surface of the second semiconductor package;
   wherein the second conductive structure contacts the first conductive structure.

3. The device of claim 2, wherein the first conductive structure is a first solder ball and the second conductive structure is a second solder ball.

4. The device of claim 1, wherein the curable fluid material has a second thermal conductivity that is greater than the first thermal conductivity.

5. The device of claim 2, wherein the curable fluid material forms a peripheral wall extending at least partially about a periphery of the second semiconductor package.

6. The device of claim 1, wherein the first die of the first semiconductor package is an exposed uppermost die.

7. The device of claim 1, wherein the first semiconductor package includes a system on a chip (SoC).

8. The device of claim 1, wherein the one or more dies of the second semiconductor package include at least one memory die encapsulated in the molding compound having the first thermal conductivity.

9. The device of claim 1, wherein the cured material comprises an electrically non-conductive material.

10. The device of claim 1 wherein, in operation, a thermal output of the first semiconductor package exceeds a thermal output of the second semiconductor package.

11. The device of claim 1, wherein the top surface of the first semiconductor package has a first area and the bottom surface of the second semiconductor package has a second area that is less than the first area.

12. A method of manufacturing a semiconductor device, comprising:

communicatively coupling a first semiconductor package and a second semiconductor package with at least one conductive structure that electrically couples the first semiconductor package with the second semiconductor package, such that a gap forms between a bottom surface of the second semiconductor package and a top surface of the first semiconductor package, wherein the second semiconductor package includes one or more dies encapsulated in a molding compound having a first thermal conductivity, and the first semiconductor package includes a first die over a second die, the first die having a bottom surface;

flowing a curable fluid material into the gap between the bottom surface of the second package and the top surface of the first semiconductor package and into contact with the at least one conductive structure within the gap, and curing the curable fluid material to form a cured material that thermally couples the top surface of the first semiconductor package to the bottom surface of the second semiconductor package, wherein the cured material has a second thermal conductivity that is greater than the first thermal conductivity;

wherein at least a portion of an upper surface formed by the curable fluid material is level with the upper surface of the second semiconductor and the curable fluid material extends about a perimeter of the upper surface of the second semiconductor package such that the upper surface of the second semiconductor package forms at least a portion of the upper surface of the semiconductor device formed by the first semiconductor device and the second semiconductor device, and wherein the curable fluid material has a bottom surface below the top surface of the first semiconductor package and below the bottom surface of the first die of the first semiconductor package.

13. The method of claim 12, wherein the at least one conductive structure comprises:
 a first conductive structure on the top surface of the first semiconductor package; and
 a second conductive structure on the bottom surface of the second semiconductor package;
 wherein the second conductive structure contacts the first conductive structure.

14. The method of claim 13, wherein the first conductive structure is a first solder ball and the second conductive structure is a second solder ball.

15. The method of claim 12, further comprising flowing the curable fluid material at least partially along sides of the second semiconductor package, such that the cured material forms a peripheral wall extending at least partially about a periphery of the second semiconductor package.

16. The method of claim 12, wherein:
 the first die of the first semiconductor package is
 an exposed uppermost die.

17. The method of claim 12, wherein the cured material comprises an electrically non-conductive material.

18. The method of claim 12, wherein the top surface of the first semiconductor package has a first area and the bottom surface of the second semiconductor package has a second area that is less than the first area.

* * * * *